United States Patent [19]

Shanks

[11] 4,346,378
[45] Aug. 24, 1982

[54] DOUBLE TRACE ELECTRO OPTIC DISPLAY

[75] Inventor: Ian A. Shanks, Malvern, England

[73] Assignee: National Research Development Corporation, London, England

[21] Appl. No.: 143,148

[22] Filed: Apr. 23, 1980

[30] Foreign Application Priority Data

May 3, 1979 [GB] United Kingdom ............... 7915425

[51] Int. Cl.³ ............................................. G09G 3/36
[52] U.S. Cl. .................................. 340/754; 340/784
[58] Field of Search ........................ 340/752, 754, 784

[56] References Cited

U.S. PATENT DOCUMENTS

| | | | |
|---|---|---|---|
| 3,975,085 | 8/1976 | Yamada et al. | 340/784 X |
| 4,127,848 | 11/1978 | Shanks | 340/784 |
| 4,250,503 | 2/1981 | Shanks | 340/754 |

*Primary Examiner*—David L. Trafton
*Attorney, Agent, or Firm*—Cushman, Darby & Cushman

[57] ABSTRACT

Two waveform traces to be simultaneously displayed are sampled and converted to a series of digital sample values. An electro-optic display, e.g. a liquid crystal or electroluminescent display has a first m set and a second n set of electrodes arranged in a matrix having $m \times n$ display elements. The matrix may be in cartesian XY or $r\,\theta$ polar co-ordinate format. In one form the m set of electrodes are arranged in two subsets alternating with one another forming a subset $m_o$ of odd rows and a subset $m_e$ of even rows. Coded waveforms $V_i$, each having a different shape over a period T are applied to one subset $m_o$ of the m electrodes while another voltage is applied to the other subset $m_e$ of m electrodes followed by application of $V_i$ to the subset $m_e$ and the other voltage to subset $m_o$. Selected ones of the coded waveform $V_i$ are generated and applied to the n electrodes, the choice of such selectively produced waveforms being related for each successive n electrode to successive sample values of the two traces and the order of coded waveforms on the m set of electrodes. As a result traces are displayed at intersections where the same waveform occurs periodically and simultaneously.

The coded waveforms $V_i$ applied to the m electrodes may be produced by a pseudo random generator. The selected ones of the coded waveforms $V_i$ applied to the n electrodes may be produced by a read only memory supplied with trace sample values stored in a random access memory. A priority encoder modified each sample value of the traces as necessary to ensure that two values for any given n electrode do not appear on the same subset of m electrodes.

13 Claims, 7 Drawing Figures

DOUBLE TRACE ELECTRO OPTIC DISPLAY

This invention relates to a method and apparatus for displaying two waveforms or traces simultaneously.

Conventionally waveforms are displayed on cathode ray tubes in which a stream of high energy electrons is swept across a phosphor screen where it impinges and causes a visible glow. It is possible to make such tubes very small e.g. down to about 3 cm diameter or diagonal but their power consumption is still high for a truly portable display. Also high voltages e.g. ~1 to 5 kV are required and the accuracy and resolution of the information displayed may be degraded compared to a larger tube.

One type of electro-optic display that has the advantage of low power consumption and low operating voltage is the liquid crystal display device. This typically comprises a thin, e.g. 12 μm, layer of liquid crystal material contained between glass plates coated on their inner surfaces with electrodes at least one of which is transparent e.g. Stannic Oxide. These electrodes may be arranged in the form of strips with those on one plate orthogonal to those on the other plate, i.e. a matrix of row and column electrodes, so forming a plurality of intersections. The electrodes may also be arranged to display information in polar co-ordinate form or in any suitable set of curvilinear co-ordinates. By applying selected electric voltages to the electrodes the liquid crystal material at their intersection is caused to change its optical property e.g. to go from light scattering to clear or between transparent and opaque states. Each area of intersection may be termed an element. Thus with the application of suitable voltages at a plurality of intersections, elements can collectively display information, for example a waveform can be displayed. One method of applying the voltages is to use signals which differ from one another by a small phase difference and applying the same phase to a particular row and to particular column electrodes with different phases elsewhere. In this method all intersections in a particular column are 'on' except that one at the particular row and column. This is described in co-pending U.K. Patent Application No. 45,957/75, U.S. Pat. No. 4,127,848.

Another type of electro-optic display that can be addressed in matrix form is the a.c. electroluminescent display in which the application of an alternating voltage across a doped phosphor layer causes light emission.

A problem common to matrix addressing is that the intersections not required to display information must receive voltages suitably different from the intersections required to show information. This problem is eased if the information required to be displayed is in the form of a single valued trace e.g. a square waveform. In this case each row and column electrode can be addressed simultaneously with its appropriate waveform. However for a 127×128 element display this requires at least 128 different waveforms. In the invention described in U.K. Patent Application No. 45,957/75 a master waveform is divided into 128 waveforms whose minimum phase difference is $2\pi/128$. Alternatively a poly frequency (e.g. 128 different frequencies) or poly-pulse width (e.g. 128 pulse widths) may be used.

In U.K. patent application No. 30898/78 binary or multi-level coded waveforms are used. For a 128×128 display 128 different waveforms are generated and applied simultaneously one to each row electrode and appropriate one of these 128 waveforms applied simultaneously to the column electrodes. The codes may be for example binary numbers or pseudo random binary sequences of logic ones and zeros. To display two waveform traces simultaneously it is necessary to say use odd columns for one waveform and even columns for the second waveform, thereby reducing display resolution by a factor of two.

The display of two traces simultaneously using conventional multiplexing techniques is not possible for large displays, e.g. a 100×100 matrix, with present materials since the ratio of the R.M.S. voltage at intersections that are ON to the R.M.S. voltage when OFF is too low e.g. about 1.09 for a 100×100 matrix display.

As used herein a matrix display is defined as a display having a set of n electrodes and a set of m electrodes forming n×m intersections or elements whereby information to be displayed is obtained by altering the optical property of the display at a desired number of intersections, the optical property being achieved by applications of appropriate voltage waveforms to the two sets of electrodes.

As used herein a threshold voltage is that R.M.S. voltage above which a desired observable optical effect occurs, e.g. liquid crystal becomes clear from a scattering state or transparent from an opaque state or vice versa.

According to this invention a method of addressing a matrix display having a set of m and a set of n electrodes forming m×n electrode intersections to display two waveform traces comprises the steps of generating a series of coded waveforms $V_i$ of common fundamental frequency but different shapes, applying the coded waveforms in turn to some of the m set of electrodes whilst the others receive another voltage signal, and simultaneously applying ones of the coded waveforms to one or more of the n set electrodes, so that the two waveform traces are displayed collectively at electrode intersections where the same coded waveform occurs on its two associated m, n electrodes to give a below display threshold R.M.S voltage and elsewhere a minimum R.M.S. voltage which is above the threshold voltage.

According to this invention apparatus for simultaneously displaying two waveform traces comprises an electro-optic display having a first m set and a second n set of electrodes arranged in a matrix having m×n display elements, means for generating a plurality of coded waveforms of different shape over a period T, means for applying a different coded waveform to some of the first set of electrodes whilst another voltage is applied to the remainder of the first set of electrodes so that all electrodes in the first set receive a coded waveform and said another voltage in turn, means for selectively producing ones of the coded waveforms for application to the second set of electrodes simultaneously with voltages applied to the first set of electrodes the choice of such selectively produced coded waveforms being related for each successive n electrode to successive sample values of the two traces and to the order of coded waveforms on the first set of electrodes, the arrangement being such that the two waveform traces appear collectively at intersections where the same waveform occurs periodically and simultaneously on both m, n electrodes to produce a below display threshold voltage level and the voltage at other intersections is above threshold level.

The coded waveforms may, for at least a portion of their period, be pseudo random binary sequence waveforms or Walsh functions. The other voltage signal may be a steady, d.c., voltage of half the voltage level of the difference between the logic zero level and the logic one level in the binary coded waveforms $V_i$. The m electrodes may be arranged alternately in two sub sets so that $V_i$ is applied to odd alternate m electrodes whilst V/2 is applied to the remaining even m electrodes, followed by $V_i$ applied to the even m electrodes and V/2 to the odd m electrodes.

The matrix may be in cartesian X, Y format r, $\theta$ polar co-ordinate format, or other curvilinear form.

The means for generating a plurality of waveforms may include a programmed memory e.g. a read only memory (ROM), a pseudo-random number generator, such as a shift register with exclusive OR or exclusive NOR feedback, or a binary code generator such as a binary counter whose outputs in the form of logic zeros and ones form different waveforms for each binary number generated, other forms of 2 level coding or multi-level coding are possible.

The two waveform traces may be sampled through a low pass filter and may be fed to a charge coupled device (CCD) whose filtered or unfiltered output is fed via a sample and hold circuit or directly into an analogue to digital converter (A/D converter). The two traces $W_1$, $W_2$ signals may be read into the CCD (used an an analogue shift register) at a high rate, until the CCD is full, and read out at a slower rate compatible with standard low power low speed A/D converters. This mode of operation of the CCD is known as bandwidth compression.

To obtain a Y shift to a displayed waveforms $W_1$ $W_2$ an offset voltage may be applied to the A/D converter or a Y shift may be obtained by adding or subtracting a digital number to the output of the A/D converter. A Y expansion (or contraction) may be obtained by applying a variable gain amplifier or attenuator before the A/D converter or by altering the full scale reference level of the A/D converter.

An X shift or expansion/contraction may be obtained by logic circuits which alters the start or sequence of the read-out of the memory used to define the signals to the second set of electrodes.

The waveform traces $W_1$ $W_2$ to be displayed may be e.g. sine waves or other continuous or piecewise continuous functions. Alternatively they may be discontinuous functions as for example when it is required to illustrate signal levels from a plurality of sensors e.g. temperature or strain gauges. Each sensor output may have a specific position along the X axis of a display and the sensor output value along the Y axis. This may be arranged so that when all sensor outputs are at their correct value the display is all along the one horizontal line i.e. the error between desired and measured sensor outputs is displayed. Furthermore different coloured areas of the display may be associated with desired operating ranges so that if an error signal is displayed it will be coloured green if within certain limits, amber between this range and other limits and red if it lies outside both these ranges.

The invention will now be described, by way of example only, with reference to the accompanying drawings of which:

Figure 1:
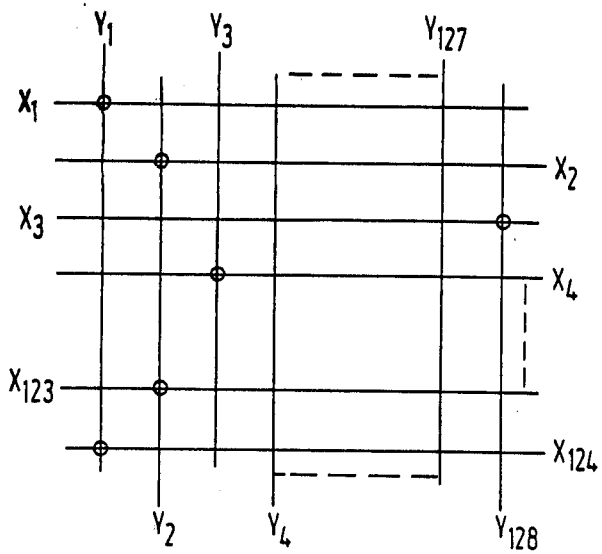
FIG. 1 is a diagrammatic view of a matrix display.

As shown in the diagrammatic view FIG. 1 a matrix display comprises 124 row and 128 column electrodes arranged as X, Y cartesian co-ordinate having 124×128 display elements formed at the intersections of the electrodes. The circled intersections are in their OFF state and collectively display the two traces required.

The traces to be displayed are sampled and each analogue sample converted to a digital value. Thus in each sample time there will be two digital numbers for display on each column of the display.

The voltages applied to the electrodes are in the form of pseudo random binary sequence waveforms having 31 periods of logic "1" and 32 periods of logic "0" each followed by a 64th period having logic "1". These have the property that $(V_i - V_j)$=constant (when $i \neq j$, and i, j are integers). For the row electrodes 62 different codes $V_1, V_2 \ldots V_{62}$ are applied one to each odd row $X_1, X_3 \ldots X_{123}$ respectively for a time period $T_1$ followed by a d.c. voltage of $\frac{1}{2}V$ for the following time period $T_2$ (equal to $T_1$); this is repeated continuously. Meantime, from the right hand end of the matrix, during $T_1$ the voltage $\frac{1}{2}V$ is applied to even row electrodes $X_2, X_4, X_6, \ldots X_{124}$ followed by codes $V_1, V_2, \ldots V_{62}$ to row electrode $X_2, X_4, \ldots X_{124}$ respectively. Thus each row electrode receives $V_i, \frac{1}{2}V, V_i \ldots$ etc. (where $i = 1, 2 \ldots 62$). The reasons for applying voltages to alternate rows from both sides of the display is to provide more space to connect signals to the finely spaced electrodes and to separate the electronic drivers to the odd and even row electrodes.

For a given intersection to adopt its OFF state identical codes are applied during either $T_1$ or $T_2$ to both the associated X, Y electrodes. For example, for $X_1, Y_1$ to be in an OFF state, $V_1$ is applied to row electrode $X_1$ and column electrode $Y_1$ during all periods $T_1$. Intersection $X_{124} Y_1$ is also required to be in an OFF state and therefore code $V_{62}$ is applied to column $Y_1$ for the periods $T_2$. The column $Y_1$ thus alternately receives codes $V_1$ and $V_{62}$ in periods $T_1, T_2$ respectively. Meantime rows $X_1$ receives $V_1, \frac{1}{2}V$ and row $X_{124}$ receives $\frac{1}{2}V, V_{62}$.

If the binary coded logic levels 0, 1 represent voltage levels O and V the R.M.S. value of the electric potential at an OFF intersection say $X_1, Y_1$, is:

$$RMS\ V_{OFF} = \left( \frac{(\frac{1}{2})^2}{2} + 0 \right)^{\frac{1}{2}} V = \frac{V}{2\sqrt{2}}$$

The value of V must be such that RMS $V_{OFF} \leq V_c$ the threshold voltage at which an element turns from OFF to ON.

At an ON intersection, say $X_2 Y_1$, the voltage is $$RMS\ V_{ON} = V \left( \frac{(\frac{1}{2})^2}{2} + \frac{1}{2}^2 \right)^{\frac{1}{2}} = \frac{V\sqrt{3}}{2\sqrt{2}}$$

-continued

The ratio $\frac{RMS\ V_{ON}}{RMS\ V_{OFF}} = \sqrt{3} = 1.732$ and is high enough to be used with known liquid crystal materials.

Similarly at column $Y_2$ the codes applied are $V_{62}$ and $V_1$ in time periods $T_1$, $T_2$ respectively corresponding to the codes applied to rows $X_{123}$ and $X_2$. This gives a below $V_c$ voltage at intersections $X_2Y_2$, and $X_{123}Y_2$.

In column $Y_{128}$ only $X_3\ Y_{128}$ intersection is shown to be displayed. Thus the codes to $Y_{128}$ are $V_2$ and $V_x$, where $V_x$ is also a pseudo random code, e.g. $V_x=V_{63}$, during time periods $T_1$, $T_2$ respectively whilst the code $V_2$ is applied to row $X_3$. The use of code $V_x$ allows one or no intersections to be displayed in a given column.

As with codes applied to the rows the codes applied to the columns are from both sides (top and bottom) to the display with alternate columns fed from the top or bottom.

Inherent in the above is the fact that two OFF elements in any one column cannot both lie in an odd row $X_1, X_3 \ldots$ or both lie on an even row $X_2, X_4 \ldots$. The reason for this is that odd rows $X_1, X_3 \ldots$ receive code $V_i$ followed by $\frac{1}{2}V$ and the column code must be $V_i$ in time period $T_1$; only one code can be applied to a column in $T_1$ representing only one OFF element. The same reasoning applies for even rows $X_2, X_4 \ldots$ since only one code can be applied to an even column during period $T_2$. As a result of information on each sample of the two traces to be displayed is examined for a possible conflict i.e. both traces to appear on an odd (or even) row. If there is no conflict, both of the trace samples can be displayed accurately on its appropriate row. However, if there is a conflict then one trace, in each sample time slot, must be given priority to appear at its correct row position. The other trace sample must be displaced one row up or down.

The pseudo random codes have 32 logic zero periods and 31 logic one periods and therefore to provide a net a.c. over 128 such periods an additional logic one period is applied to all row and column electrodes. Each such period should be ~256 μsec to give a fundamental frequency for the drive waveforms of ≳30 Hz to avoid flicker of the display. The sequence is as shown in Table 1.

TABLE 1

| Electrodes | Period T₁ | | Period T₂ | |
|---|---|---|---|---|
| | 63 × 256 μsec | 1 × 256 μsec | 63 × 256 μsec | 1 × 256 μsec |
| Odd rows | $V_i$ | V | V/2 | V/2 |
| Even rows | V/2 | V/2 | $V_j$ | V |
| Columns | $V_k$ | V | $V_m$ | V |

$V_i, V_j, V_k, V_m$ are pseudo random binary codes V and V/2 are d.c. voltage levels with V=logic one.

Pseudo random binary number sequences may be generated as follows. If a 3-bit register with exclusive NOR feedback from its first and third outputs (i.e. its first and third stage outputs are connected to an exclusive NOR gate whose output is fed back into the shift register) then the stages of the register will show the following states as it is clocked from a starting point of content 000.

TABLE 2

| Clock Pulse Number | Bit 1 | Bit 2 | Bit 3 |
|---|---|---|---|
| 0 | 0 | 0 | 0 |
| 1 | 1 | 0 | 0 |
| 2 | 0 | 1 | 0 |
| 3 | 1 | 0 | 1 |
| 4 | 1 | 1 | 0 |
| 5 | 0 | 1 | 1 |
| 6 | 0 | 0 | 1 |
| (7) | 0 | 0 | 0 |

The binary number constituted by bits 1 to 3 jumps randomly within its possible range until on clock pulse 7 the sequence starts to repeat. The bit 1 output consists of a pseudo random sequence of "1" and "0" states until it starts to repeat itself on clock pulse 7. This is also referred to as an M-sequence (M for maximum) by mathematicians. If bit 3 is connected into a further 4-bit shift register which is clocked synchronously with the first register then 7 outputs in all are obtained. These give the following binary waveforms:

TABLE 3

| Register Output Number | Clock Pulse Number<br>0 1 2 3 4 5 6   7 8 9 |
|---|---|
| 1 | 0 1 0 1 1 0 0   0 1 0... |
| 2 | 0 0 1 0 1 1 0   0 0 1... |
| 3 | 0 0 0 1 0 1 1   0 0 0... |
| 4 | 1 0 0 0 1 0 1   1 0 0... |
| 5 | 1 1 0 0 0 1 0   1 1 0... |
| 6 | 0 1 1 0 0 0 1   0 1 1... |
| 7 | 0 0 1 1 0 0 0   1 0 1... |

Note that each output is delayed by one clock pulse from the previous and that the voltage difference (0—0≡0 volts; 1—0≡V;0—1≡V; 1—1≡0 volts) between any two outputs is net a.c. over every seven bits and has an RMS value of $V\sqrt{4/7}$. The method can be extended to an N-bit shift register with exclusive NOR feedback. If this is cascaded into a parallel output second register having $2^N-1$ bits, $2^N-1$ outputs are obtained from this second register, each of which gives a different pseudo-random waveform which lasts for $2^N-1$ bits before repeating itself and which has $2^{(N-1)}-1$ '1' bits and $2^{(N-1)}$ '0' bits.

The voltage difference between any two such waveforms is always a.c. and given by $$(V_i - V_j)_{RMS} = V\sqrt{\frac{2^{N-1}}{2^N - 1}}$$

Figure 2:
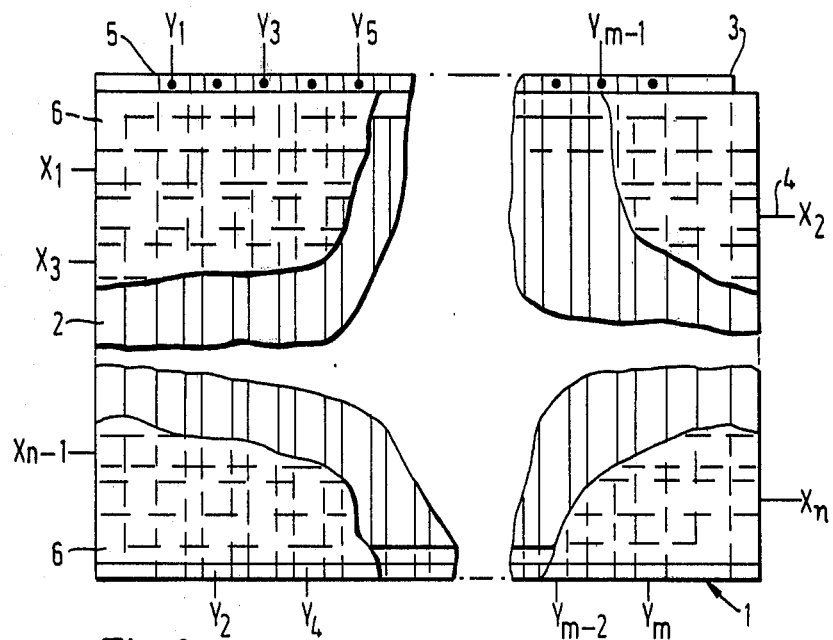
FIG. 2 is a view of a liquid crystal display.
Figure 3:
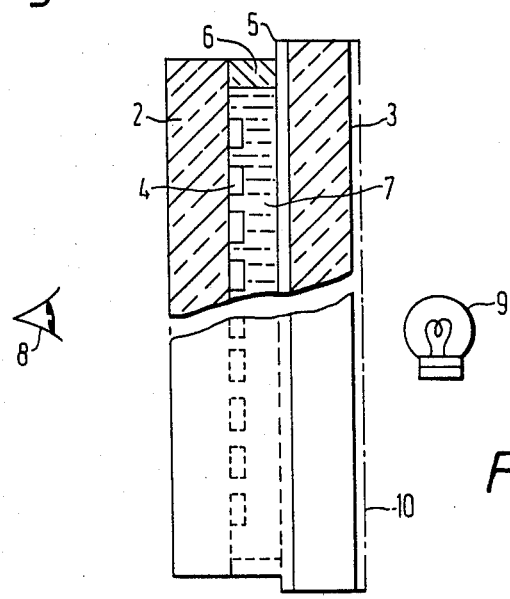
FIG. 3 is a cross-sectional view of FIG. 3.

Note that $(V_i - V_j)_{RMS} \longrightarrow \frac{V}{\sqrt{2}}$ as $N \longrightarrow \infty$ FIGS. 2 and 3 show a liquid crystal display 1 having an m×n element display. It comprises two glass plates 2, 3 carrying spaced strip electrodes 4, 5 arranged in an X Y matrix form. These strips 4, 5 are of stannic oxide typically ~$10^4$Å thick (resistivity ≈1-1000Ω/☐), 600 μm wide and spaced 50 μm apart. To obtain the strips 4, 5, the plates 2, 3 are coated with stannic oxide, e.g. by sputtering, and then etched through photolithographic or screen printed masks in a conventional manner. A spacer ring 6 maintains the plates 2, 3 about 12 μm apart, an epoxy resin glue fixes the plates 2, 3 and spacer 6 together. Between the plates 2, 3 is a cholesteric liquid crystal material 7 incorporating a dichroic dye. Suitable materials are: E18 (nematic) with about 6% CB 15 (cholesteric) (both materials are obtainable from B.D.H. Chemicals Ltd., Poole, Dorset) and one or more of the following pleochroic dyes:

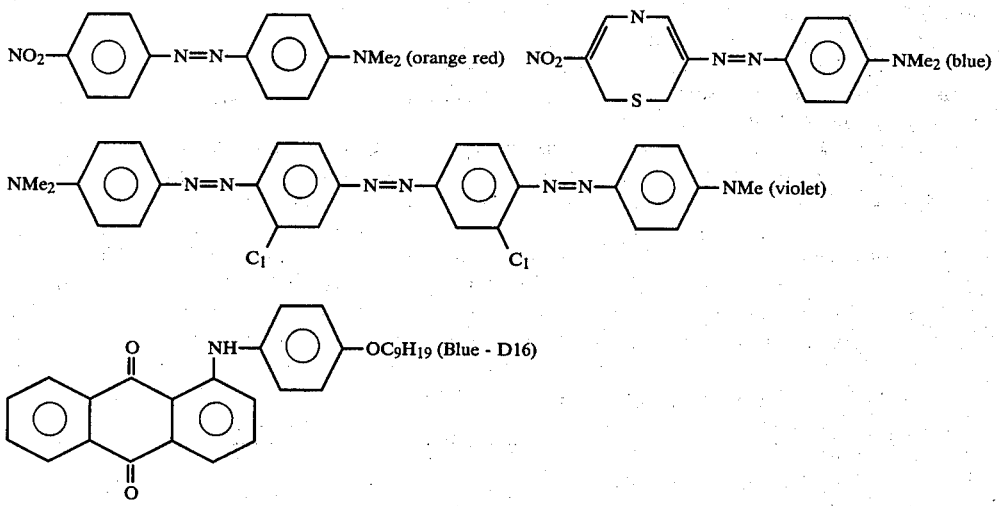

Such a cell operates by the cholesteric to nematic phase change effect in which the liquid crystal material changes from a light scattering (OFF) state to a light transmissive (ON) state on application of an above threshold voltage.

The display may be observed 8 by light transmission using natural, fluorescent or an electric light 9 behind the display or by projecting an image of the display 1 onto a magnifying lens or mirror or a reflecting screen. Alternatively a reflector 10 may be placed against the outer surface of plate 3 (or the surface silvered) and the display observed by reflected light.

Threshold voltage is about 7 volts and thus with an applied voltage of 13.5 volts $(V_i-V_j)_{RMS}$ is about 4.8 volts on an OFF element and about 8.2 volts on an ON element. With 8.2 volts across an intersection it appears clear or the colour of the reflector. With 4.8 volts across an intersection it appears strongly coloured because of the pleochroic dye or dyes.

The display of FIGS. 2, 3 may also use a nematic E18 or nematic E18 and 1% C15 (B.D.H. Chemicals Ltd.) cholesteric mixture as a twisted nematic cell or Schadt & Helfrich cell.

The twisted nematic cell comprises a thin e.g. 12 μm thick, layer of nematic liquid crystal material contained between the two glass plates which have been unidirectionally rubbed to align the liquid crystal molecules and arranged with the rubbing directions orthogonal. This results in a twisted molecular structure which rotates plane polarised light whose $\underline{E}$ vector lies parallel or perpendicular to the optical axis of the liquid crystal at the surface of the cell in the absence of an electric field and when a voltage (preferably a.c. 25 Hz–100 kHz) above a threshold (typically 1 volt for a 12 μm thick layer) is applied the molecules are re-orientated and the layer ceases to rotate plane polarised light. The cell is placed between polarisers with their optical axes parallel or crossed so that light transmission or extinction is obtained by switching the voltage on or off. Small amounts e.g. 1% of a cholesteric material may be added to the liquid crystal material, also small amounts of a dichroic dye may be added in which case one or both polarisers is omitted from the display.

As an alternative to rubbing, the plates may have magnesium fluoride or silicon monoxide deposited by a technique known as oblique evaporation with an angle of incidence of an evaporating beam to the plates of between 5° and/or 30° as described in U.K. Patent No. 1,454,296.

A liquid crystal cell responds to the RMS value (rather than the instantaneous value) of a waveform providing the period is shorter than the sum of the cell turn on and turn off time. If the waveform period is longer the liquid crystal can turn on and off within one waveform period. For a twisted nematic cell this typically means that the waveform frequency is greater than 25 Hz.

When a twisted nematic liquid crystal display is used the polarisers may be coloured differently in different parts of the display.

Apparatus for applying the codes to the display of FIG. 1 will now be described with reference to FIGS. 4, 5, 6, 7.

A liquid crystal X-Y matrix display 1 has 124 row or X electrodes with odd rows connecting to 64 bit shift registers 20 from the left hand side of the display and even rows connecting to 64 bit shift registers 21 on the right hand side. The 128 column or Y electrodes have odd columns connected at the top to a 64 bit shift register 22 and even columns connected at the bottom to a 64 bit shift register 23. Each 64 bit shift register 20, 21, 22, 23 is a serial in parallel out shift and store bus register having a data input D, output Q, clocking input C, strobe input S. Information applied to the input D is shifted one bit at a time by each clocking pulse applied at C. Information in the registers are applied simultaneously to each output Q on application of a strobe pulse to the strobe input S. The row or X registers 20, 21 have outputs $Q_0$ and $Q_{63}$ unconnected and have a disabling input E which on receipt of a logic one open circuits each output Q. Additionally the X registers 20, 21 have each output $Q_i$ connected (FIG. 7) through 10 Kohm resistors 26, 27 to a voltage supply, the odd row register output being connected to a supply marked A whilst the even row register outputs are connected to a supply marked B.

Pseudo random binary squences for application to the columns $Y_{1-28}$ are generated in an 8-bit serial in parallel out shift register 24 having feedback from its outputs $Q_0$ and $Q_5$ through an exclusive NOR gate 25 to its input D. The register is clocked by application of pulses to its clocking input C and reset by application of a pulse to a reset R. The pseudo random sequence generated is taken from output $Q_5$ to the inputs D of both row registers 20, 21.

Information to be displayed as two traces $W_1$, $W_2$ is sampled to provide 128 samples values for each trace and the samples are converted into digital words. These words are fed into 16 inputs $D_0$ to $D_{15}$ of a 128×16-bit random access memory RAM 28. The digitised samples for one trace $W_1$ are applied to inputs $D_0$ to $D_7$ whilst those for the other trace $W_2$ are applied to inputs $D_8$ to $D_{15}$. The memory 28 address position is controlled by application of a 7-bit word to inputs $A_0$ to $A_6$. Information is written into the RAM 28 on receipt of a pulse to a read/wirte input R/W from monostables 29, 30 themselves controlled by a pulse from the A/D converter (not shown). The RAM address control words are received through 7×2:1 multiplexer 31 from either a write address (W/A) 8-bit binary counter 32 or a read address (R/A) 8-bit binary counter 33. The selection of which counter 32 or 33 is connected to the RAM 28 is controlled by a pulse from the A/D converter to an input C on the 7×2:1 multiplexer 31; a logic one pulse connects the W/A counter 32 to the RAM 28 whilst a logic zero connects the R/A counter 33 to the RAM 28. The W/A counter 32 is clocked by the monostable 30 output. Thus information is written into consecutive positions of the RAM on receipt of each pulse from the A/D converter. The R/A counter 32 is clocked by pulses to input C by a master clock 34 at a frequency of 500 kHz i.e. clocked every 2 $\eta$sec. The R/A counter 33 is reset by a pulse to a reset input R from its 8th bit output $Q_7$ through an OR gate 35. The RAM 28 has 16 outputs $Q_0$ to $Q_{15}$ of which $Q_0$ to $Q_7$ define 7-bit words for each sample value of trace $W_1$ and $Q_8$ to $Q_{15}$ define 7 bit words for each sample value of trace $W_2$.

As previously discussed with reference to FIGS. 1 in any one column only one trace may occur on an odd row (and only one on an even row). The reason for this being that odd rows receive V/2 during period $T_2$ and $V_i$ during $T_1$ when the appropriate columns should receive $V_i$. A similar but converse argument applies for even rows.

Thus, during periods $T_1$ of the display, only column sequences representing samples to be displayed on odd rows must be generated from the output $D_0$ of the ROM 50 which feeds the column shift and store bus register 22 and 23. Similarly during periods $T_2$ only column sequences representing samples to be displayed on even rows must be generated from the output $D_0$ of the ROM 50.

This is achieved by a priority encoder 36 having 16 inputs from the RAM 28 and having a 6-bit output $Q_1$ to $Q_6$ to an 8-bit full binary adder 37. The priority encoder 36 also checks to see if two sample values at each column would both occur on even, or odd rows. If so it shifts one of the sample values one row up or down in a manner related to the quatisation noise from the A/D converter.

Figure 5:
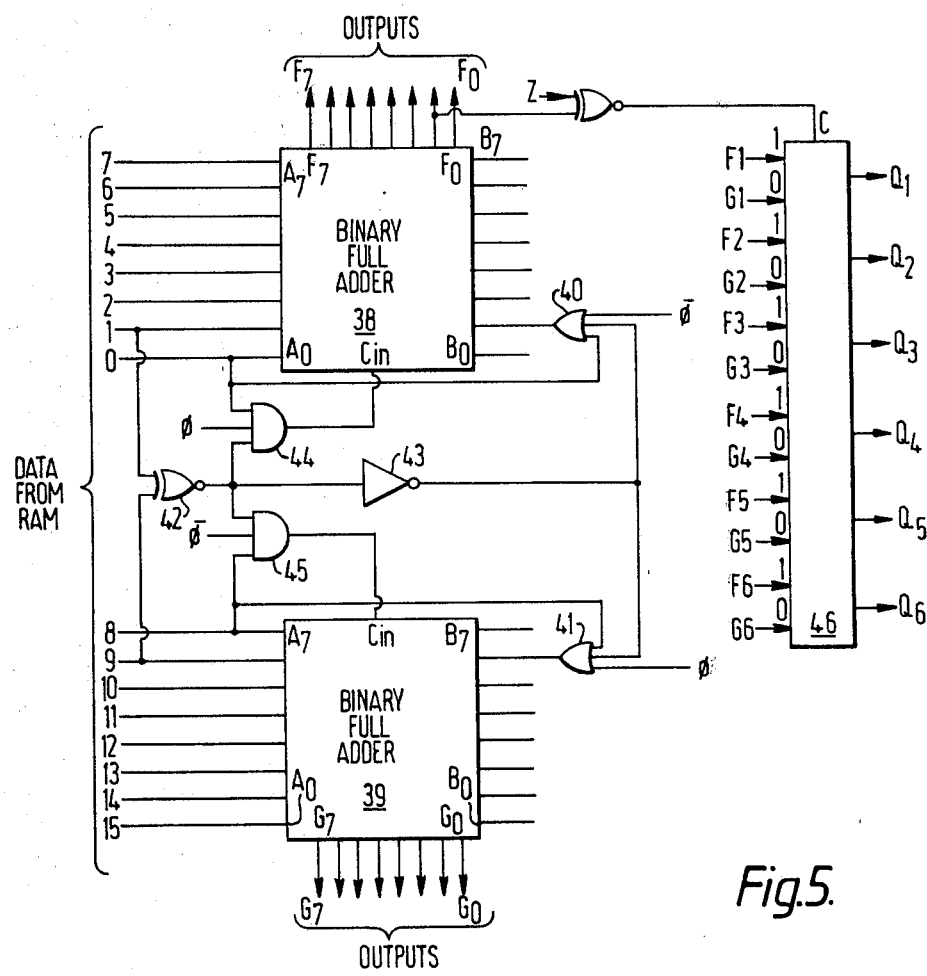
FIG. 5 is a circuit diagram of the priority encoder shown in outline in FIG. 4.

FIG. 5 shows details of the priority encoder 36. It comprises a first and a second 8-bit full adder 38, 39 each having two sets of 8-inputs $A_0$ to $A_7$ and $B_0$ to $B_7$. Inputs $A_0$ to $A_7$ on the first adder 38 are from outputs $Q_0$ to $Q_7$ from the RAM 28 representing sample values from $W_1$. Likewise inputs $A_0$ to $A_7$ on the second adder 39 represent $W_2$. Of the adders' inputs $B_0$ to $B_7$ only $B_1$ are used and are connected to OR gates 40, 41. An exclusive NOR gate 42 has two inputs, one connected to the RAM 28, $Q_1$ output and the other to the RAM 28 output $Q_9$ for the purpose of checking whether both the trace samples formed by the numbers on $A_1$ to $A_7$ of the adders 38, 39 are simultaneously odd or even. The exclusive NOR gate 42 output is connected through an inverter 43 to both OR gates 40, 41 and thence to the adders inputs $B_1$, $B_1$. These OR gates 40, 41 have an input connected to the least significant bit of their associated adders 8 bit words input. First and second AND gates 44, 45 each have three inputs, and an output which is connected to the CARRY input $C_{in}$ of the first and second adder 38, 39. The first and second AND gates 44, 45 have one input connected to the least significant bit of the 8-bit input to their associated adder; another input connected in common to the exclusive NOR gate 42 output and another input connected to input signals $\phi$ and $\bar{\phi}$ respectively.

Figure 6:
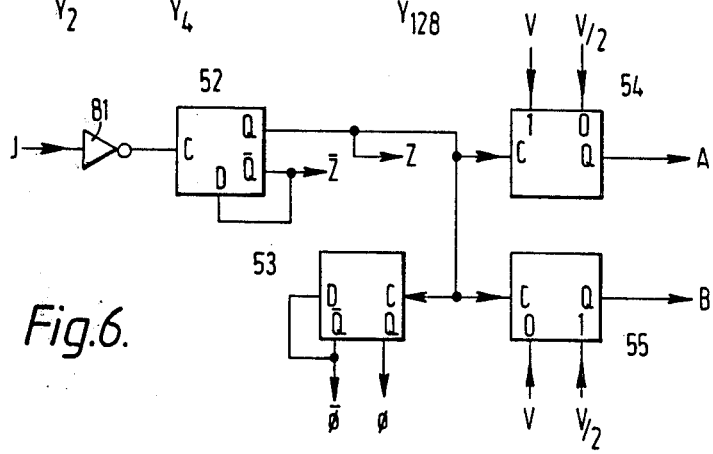
FIG. 6 shows timing circuity for a part of FIG. 4.
Figure 7:
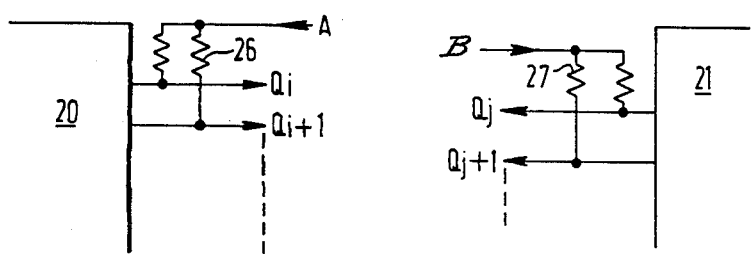
FIG. 7 shows how a voltage source is connected to part of FIG. 4.

Input signals $\phi$ and $\bar{\phi}$ are also connected to the OR gates 40, 41 and are generated as shown in FIG. 6.

The first adder 38 has an 8-bit output on outputs $F_0$ to $F_7$. The least significant bit $F_0$ is left unconnected whilst bits $F_1$ to $F_6$ are connected to a 6×2:1 multiplexer 46 having a 6-bit output $Q_1$ to $Q_6$. The second adder 39 has its outputs $G_1$ to $G_6$ connected to the multiplexer 46. This multiplexer 46 is controlled through input C by the output of $F_1$ and a signal Z (generated as shown in FIG. 6) through an exclusive NOR 47 gate to determine which of the inputs F or G pass to the output Q. The multiplexer 46 outputs $Q_1$ to $Q_6$ form the outputs of the priority encoder 36 shown in outline in FIG. 1.

Table 1 shows the priority encoder 36 output for all combinations of the two least significant bits in the two 8-bit words to the adders 38, 39 representing both trace samples.

TABLE 4

| Trace 1 (Adder 38) | | Trace 2 (Adder 39) | | Adder Outputs | |
|---|---|---|---|---|---|
| $A_1$ | $A_0$ | $A_1$ | $A_0$ | when $\Phi = 1$ | when $\Phi = 1$ |
| 0 | 0 | 0 | 0 | $W_1, W_2 + 2$ | $W_2, W_1 + 2$ |
| 0 | 1 | 0 | 0 | $W_2 + 2, W_1 + 3$ | $W_1 + 2, W_2$ |
| 1 | 0 | 0 | 0 | $H + 2$ | $H + 2$ |
| 1 | 1 | 0 | 0 | $H + 2$ | $H + 2$ |
| 0 | 0 | 0 | 1 | $W_1, W_2 + 2$ | $W_2 + 3 W_1 + 2$ |
| 0 | 1 | 0 | 1 | $W_1 + 3 W_2 + 2$ | $W_2 + 3 W_1 + 2$ |
| 1 | 0 | 0 | 1 | $H + 2$ | $H + 2$ |
| 1 | 1 | 0 | 1 | $H + 2$ | $H + 2$ |
| 0 | 0 | 1 | 0 | $H + 2$ | $H + 2$ |
| 0 | 1 | 1 | 0 | $H + 2$ | $H + 2$ |
| 1 | 0 | 1 | 0 | $W_1, W_2 + 2$ | $W_2, W_1 + 2$ |
| 1 | 1 | 1 | 0 | $W_2 + 2, W_1 + 3$ | $W_2, W_1 + 2$ |
| 0 | 0 | 1 | 1 | $H + 2$ | $H + 2$ |
| 0 | 1 | 1 | 1 | $H + 2$ | $H + 2$ |
| 1 | 0 | 1 | 1 | $W_1, W_2 + 2$ | $W_1 + 2, W_2 + 3$ |
| 1 | 1 | 1 | 1 | $W_1 + 3, W_2 + 2$ | $W_1 + 2 W_2 + 3$ |

$H = W_1$ and $W_2$

The 6 bit numbers from the priority encoder 36 are received by inputs $A_0$ to $A_5$ of the 8-bit binary full adder 37. An 8-bit binary counter 48 has its outputs $Q_0$ to $Q_5$ connected to inputs $B_0$ to $B_5$ of the adder 37 whilst the 7th bit $Q_6$ resets the counter 48 via a reset R, resets bistables 56 and 47 and resets the R/A counter 33 via the OR gate 35. Clocking pulses to the 8-bit counter 48 are applied to clocking input C from the $Q_7$ output of the R/A counter 33. A NOR gate 49 has six inputs, one from each of the counters 48 $Q_0$ to $Q_5$ outputs, and has an output of a logic 1 which provides a signal J during the 64th clocking period of the counter 48. An AND gate 80 has six inputs from $Q_0$ to $Q_5$ of the counter 48 and has a logic 1 output during the 63rd clocking period of the counter 48.

The 7-bit number outputs from the adder 37 are received by a 128×1 read only memory ROM 50 which provides a single bit output at $D_0$ for each of its 128 address locations when supplied with an appropriate binary number address. Since the numbers from the RAM 20 have a one added by the priority encoder 36 the ROM 50 is programmed with the first bit of the pseudo random sequence in address one, the second in address two etc. and the last (63d) bit of the repeated sequence in addresses zero and 126. Output $D_0$ from the ROM 50 is passed through an OR gate 51 to the serial inputs D of the two column registers 22, 23.

The signals Z, $\overline{Z}$, $\phi$, $\overline{\phi}$, A, B FIG. 6 are derived as follows: The signal J, from counter 48, is fed via an inverter 81 to the clock input C of a bistable 52 whose outputs Q, and $\overline{Q}$ form signals Z and $\overline{Z}$ respectively. The output Q also forms a clock input to a further bistable 53 whose outputs Q and $\overline{Q}$ form the signals $\phi$, and $\overline{\phi}$ respectively. The output Q from the first bistable 52 also forms the control to two 2:1 multiplexers 54, 55 whose outputs Q form the signals A, B respectively. The multiplexer 54 is supplied with V/2 to its input $\underline{0}$ and V to its input $\underline{1}$ whilst the multiplxer 55 has V (13.5 volts) applied to its input $\underline{0}$ and V/2 to inputs $\underline{1}$. The logic for these multiplexers is that a logic zero at C connects input P to output Q.

The master clock 34 supplies clocking pulses to the input C of a bistable 56 whose outputs Q, $\overline{Q}$ form clocking pulses in antiphase to the even column register 23 and odd column register 22 respectively.

Clocking pulses for th row registers 20, 21 and the register 24 are supplied through an AND gate 62 and a shaping network 58, 59, 60 from output Q of a bistable 57 which takes its input from the $Q_6$ output of the R/A counter 33. The shaping network consists of a one nanofarad capacitor 58 in series with a diode 59 and a one kohm resistor 60 in parallel to ground. This circuit provides via buffer amplifiers (not shown) a voltage spike every 256 μsec for clocking the row registers 20, 21 and strobing both column and row registers 20, 22, 21, 23. Every 64th row clocking pulse is prevented from reaching the registers 20, 21, 24 by a logic 1 from AND gate 80 passing through an inverter 61 to the AND gate 62.

Figure 4:
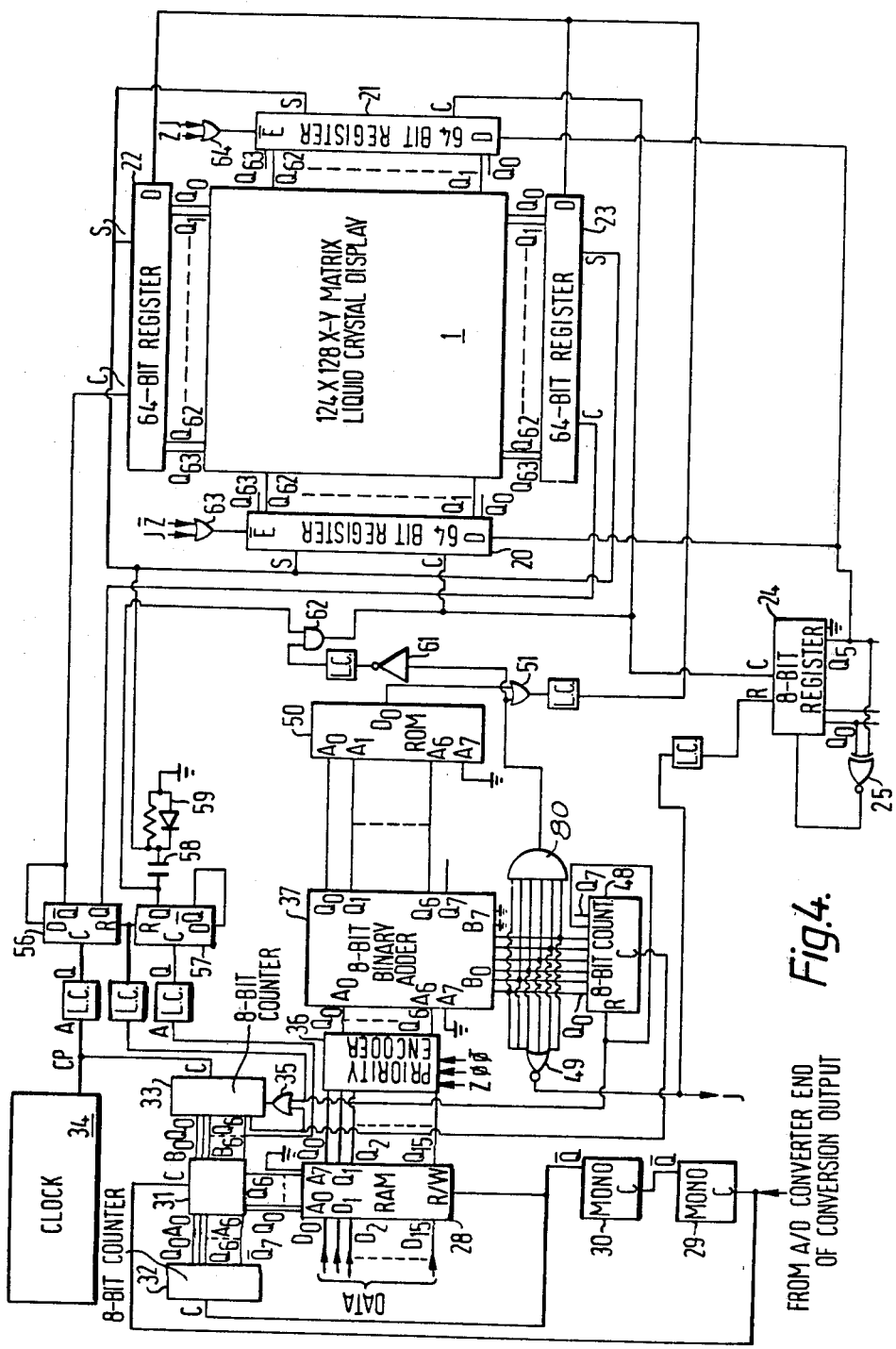
FIG. 4 is a block diagram showing the display and drive voltage circuits for a 124×128 element display.

The signal J is fed to the reset R of register 24 and to one input of the OR gates 63, 64. The clocking bistables 56, 57 are reset by the $Q_6$ output of the counter 48. Different components within the circuit operate at different voltage levels and so-called level converters, indicated by LC are shown in FIG. 4 without reference numerals. These allow the display drive waveforms to have voltage levels between 0 & 13.5 volts.

Operation of the circuit of FIGS. 4, 5, 6, 7 is as follows: Dealing first with the timing of the various clocking pulses, the master clock 34 delivers a pulse every 2 μsec which causes the bistable 56 to clock the column registers 22, 23 in antiphase every 4 μsec. Also the clock 34 clocks the R/A counter 33 evey 2 μsec so that its $Q_6$ output provides a clock pulse every 128 μsecs into the bistable 57 whose Q output applies both a clocking and strobing pulse to both row registers 20, 21 and a strobe pulse to both column registers 22, 23 every 256 μsec.

The R/A counter 33 $Q_7$ output resets the counter 33 and provides a pulse every 256 μsec as the $Q_7$ output goes to a logic 1. This $Q_7$ output also clocks the counter 48 every 256 μsec. After 63×256 μsec there will be a logic 1 on all outputs $Q_0$ to $Q_5$ on the counter 48 resulting in a pulse from the AND gate 80 during the 63rd clocking of counter 48. After 64 clock pulses to the counter 48, its $Q_6$ output goes to a logic 1 thereby resetting the counter 48 via its reset R and providing a logic 1 output of the NOR gate 49 and J which lasts for 256 μsec.

The signal J changes the bistable 52 (FIG. 6) output at the end of each J pulse. Thus signal Z will be a logic 1 for 64×256 μsecs and then logic zero for the next 64×256 μsec, i.e. Z will be a logic 1 for period $T_1$ and logic zero for period $T_2$. Similarly $\overline{Z}$ will be a logic zero for period $T_1$ and logic 1 for period $T_2$.

The signal Z changes the state of bistable 53 on each positive transition so that $\phi$ is a logic 1 for 2×64×256 μsec i.e. for a period $T_1$ plus $T_2$. Logic ones and zeros alternate on $\overline{\phi}$ and $\phi$ with a period of $2(T_1+T_2)$.

When Z is a logic 1 then A from multiplexer 54 is V and signal B is V/2 for the period of $T_1$. When Z is a logic zero then A is V/2 and B is V for period $T_2$.

Generation and application of row sequences $V_i$ is as follows: At the start of the period $T_1$ the shift register 24 has been reset to zero, signal Z is a logic 1 so that the even row register 21 has its outputs open circuit and signal B=V/2 is applied to all even rows. Every 256 μsec the register 24 is clocked to generate sequences $V_i$, which are simultaneously clocked into both odd and even row registers 20, 21 respectively and passed into the odd row register outputs and electrodes $X_1$, $X_3$ ... by a strobe pulse every 256 μsec. Meanwhile the counter 48 is also clocked every 256 μsec and after 63 clock pulses to both counter 48 and register 24 a logic 1 lasting 256 μsec is generated by the AND gate 80. This signal inhibits the 64th clock pulse clocking the row registers 20, 21 and register 24 via the inverter 61 and AND gate 62. The 64th clock pulse resets the counter 48 and causes signal J for 256 μsec to be logic 1. The signal J resets the register 24 and via the OR gate 63 open circuits the odd row register 20 outputs. Thus during this 64th period of 256 μsec signal A=V is applied to all odd rows $X_1$, $X_3$ ... whilst the even rows $X_2$, $X_4$ ... continue to receive V/2.

At the end of 64×256 μsec, i.e. period $T_1$, pulse signal J returns to logic 0 and via inverter 81 changes the bistable 52 and changes $\overline{Z}$ to a logic 1. This $\overline{Z}$ open circuits the odd row register 20 so that the odd rows $X_1$, $X_3$ ... will receive signal A which is now V/2. All even rows $X_2$, $X_4$ ... receive the sequences $V_i$ for 63×256 μsec after which J again becomes a logic 1 to open circuit the even row register 21 outputs and allow signal B=V onto $X_2$, $X_4$ ... for the 64th period of 256 μsec whilst odd rows $X_1$, $X_3$ continue to receive V/2. At the end of this 64th 256 μsec period, i.e. the end of $T_2$, the signal J falling restarts the whole cycle of sequences onto the row electrodes during periods $T_1$, $T_2$.

The sequences generated for application to the column registers 22, 23 are related both to the value of each trace $W_1$, $W_2$ sample and to the order of codes $V_i$ applied to the row $X_i$ electrodes. This is achieved as follows: When required, data in the form of two eight bit numbers is fed from the analogue to digital converters (not shown) to inputs $D_0$ to $D_7$ and $D_8$ to $D_{15}$ of the RAM 28. An end of conversion pulse from the A/D converter changes the RAM 28 address from the R/A counter 33 to the W/A counter 32 by switching the multiplexer 31. After a delay set by the monostable 29 the read write terminal R/W is pulsed by monostable 30 to enter the data on inputs $D_0$ to $D_{15}$ and increment the W/A counter 32.

At the termination of the end of the end of coversion pulse, and until new data is to be read into the RAM 28 the RAM 28 outputs two 8-bit words, representing stored sample values of $W_1$, $W_2$, every 2 $\mu$sec under the control of the address numbers from the R/A counter 33; the two numbers appearing at outputs $Q_0$ to $Q_7$ and $Q_8$ to $Q_{15}$ being the two 8-bit numbers in the memory at the location (0 to 128) defined by the address number.

The two 8-bit numbers from the RAM 28 are fed into the priority encoder 36 every 2 $\mu$sec. These 8-bit numbers represent the sample values of traces $W_1$, $W_2$. The priority encoder 36 checks to see if whether both numbers are both logic 1 or logic 0 in their 2nd bit i.e. the bits on RAM 28 outputs $Q_1$, and $Q_9$. This check corresponds to checking if both traces $W_1$ and $W_2$ would appear on an odd or both on an even row of the display. If this is not the case then both adders 38, 39 output (on F and G) binary numbers $W_1+2$ and $W_2+2$ as shown in table 2. The reason for adding +2 to both trace values is to simplify the circuitry, by avoiding the need for subtraction, should one of the trace values required display on a lower row than indicated by its value to avoid conflict of two traces on an odd (or even) row. If the bits on RAM $Q_1$ and $Q_9$ are the same then the output of the adders 38, 39 is as given in the Table 2. The signals $\phi$, $\bar{\phi}$ are used to define which data value has priority (i.e. is not shifted up or down) in each 2 $\mu$sec period. This ensures that the 6-bit numbers formed by $F_1$ to $F_6$ and $G_1$ to $G_6$ cannot both be numbers for simultaneous appearance on an odd (or an even) row of the display.

Which of the numbers $F_1$ to $F_6$ or $G_1$ to $G_6$ is output on $Q_1$ to $Q_6$ of the encoder 36 is decided by the 6×2:1 multiplexer 46 controlled through the exclusive NOR gate 47 by signal Z and output $F_1$ of the adder 38. As already noted signal Z is a logic 1 during period $T_1$ when information is written on odd rows $X_1$, $X_3$ etc. Thus during $T_1$ the output of the encoder 36 gives all (odd) numbers from either trace to appear on odd rows $X_1$, $X_3$.... Likewise when Z=0 during $T_2$ the encoder 36 output gives all (even) numbers from either trace to appear on even rows $X_2$, $X_4$.... The encoder 36 output numbers are fed into the adder where they are summed with the outputs of the counter 48. This counter 48 is clocked every 256 $\mu$sec which means that a zero is added to the encoders 36 output for one complete reading of the RAM 28, followed by a one added to the encoders output for one complete reading of the RAM, followed by a two added etc. up to a total of adding 63.

The output of the adder 37 addresses the ROM 50 causing it to output serially all the first bits of the required codes $V_i$ for the columns (one bit every 2 $\mu$sec), then all the second bits etc. These "bit-serially" interlaced column codes are then fed serially into the odd and even column registers 22, 23 which are clocked in antiphase every 4 $\mu$sec by the bistable 56. When the 128 bits are adjacent to their appropriate column Y electrode these registers 22, 23 are strobed, every 256 $\mu$sec, and the new data entered onto the Y electrodes. Thus a total of 128 bits are received by the registers 22, 23 (64 in each) for each increment of the counter 48. When this counter 48 has counted to 63 a logic 1 is fed from the AND gate 80 via the OR gate 51 into the serial input of the column registers 22, 23, which continue to be clocked in anti-phase every 4 $\mu$sec thereby filling the registers 22, 23 with logic ones (i.e. V) that are applied to electrodes $Y_1$, $Y_2$ ... during the 64th 256 $\mu$sec sub periods of periods $T_1$ and $T_2$ as noted in Table 1 when signal J is logic "1" to provide a net a.c. voltage to each Y column electrode within each period $T_1$ and $T_2$.

The ROM is programmed so that, when the counter 48 has an output of 1, the ROM output successively provides the first bit of 63-bit pseudo random binary sequences for application to each of the columns $Y_1$ to $Y_{128}$, the sequence being related to both the stored appropriate trace sample va;ue (in each 2 $\mu$sec interval) and the column electrode position. During the next 256 $\mu$sec when the counter 48 has a binary number output of two the ROM outputs successively the second bits in the 63-bit sequences and so on for a total of 63×256 $\mu$sec. Although only a total of 63 difference sequences are generated 128 ROM address positions are required to allow room to repeat the 63 sequences.

When the display operates with the cholesteric to nematic phase change effect described above, a quicker change to fresh traces is achieved by switching off all voltages to display for a short time, about the liquid crystal response time. This is followed immediately by application of voltages representing the new traces. Without such removal of voltages the old traces may persist for a short time on changing to new traces.

I claim:

1. Apparatus for simultaneously displaying two waveform traces comprising:
   (i) an electro optic display having a layer of display material between two dielectric substrates, a first series of m strip electrodes on one substrate and a second series of n strip electrodes on the other substrate arranged to define an m×n plurality of elements across which an electric signal may be applied to change the layer from one state to another thereby causing an observable display effect;
   (ii) means for generating m different coded reference waveforms from different L-bit, N'-ary numbers whereby each waveform has a different shape over a period t, L and N' being integers greater than 1;
   (iii) means for supplying a secondary voltage signal different from all the coded reference waveforms;
   (iv) means for applying a different one of said coded reference waveforms to some of the first set of electrodes whilst applying said secondary voltage signal to the remainder of the first set of electrodes so that all electrodes in the first set receive one of said coded waveforms and said secondary voltage signal in turn;
   (v) means for selectively producing ones of the coded waveforms for application to the second set of electrodes simultaneously with coded waveform voltages applied to the first set of electrodes, the choice of such selectivity produced coded waveforms being related for each successive n electrode to successive sample values of the two traces, and to the order of coded waveforms on the first set of electrodes;
   (vi) the arrangement being such that the two waveform traces appear collectively at intersections where the same waveform occurs periodically and simultaneously on both m, n electrodes to produce a below display threshold voltage level and the voltage at other intersections is above threshold level.

2. Apparatus according to claim 1 wherein the first set of m electrodes are arranged in two subsets alternating with one another.

3. Apparatus according to claim 2 and further comprising a priority encoder for ensuring that two values of the two traces do not appear on the same subset of m electrodes on a given n electrode.

4. Apparatus according to claim 1 wherein the electro-optic display is a liquid crystal display.

5. Apparatus according to claim 4 wherein the display includes a cholesteric liquid crystal material.

6. Apparatus according to claim 4 wherein the display is arranged to provide a progressive molecular twist across the layer liquid crystal material.

7. Apparatus according to claim 4 wherein the liquid crystal material contains an amount of dye.

8. Apparatus according to claim 1 wherein the coded waveforms are binary coded waveforms.

9. Apparatus according to claim 8 wherein the binary coded waveforms are for at least a portion of their sequence pseudo random codes.

10. Apparatus according to claim 8 wherein the means for selectively producing ones of the coded waveforms comprises a read only memory.

11. Apparatus according to claim 3 comprising a random access memory for storing sample values of traces to be displayed.

12. Apparatus according to claim 1 comprising means for changing information representing the two traces to be displayed.

13. Apparatus according to claim 11 comprising charge coupled devices for sampling two traces to be displayed and analogue to digital converters for providing sample numbers to be entered into a random access memory.

* * * * *